United States Patent
Waldman et al.

(10) Patent No.: US 7,276,394 B2
(45) Date of Patent: Oct. 2, 2007

(54) LARGE AREA FLAT IMAGE SENSOR ASSEMBLY

(75) Inventors: Jaime I. Waldman, Pittsford, NY (US); Mario J. Ciminelli, Rochester, NY (US); Michael A. Marcus, Honeoye Falls, NY (US)

(73) Assignee: Eastman Kodak Company, Rochester, NY (US)

( * ) Notice: Subject to any disclaimer, the term of this patent is extended or adjusted under 35 U.S.C. 154(b) by 246 days.

(21) Appl. No.: 10/922,529

(22) Filed: Aug. 20, 2004

(65) Prior Publication Data

US 2005/0019987 A1 Jan. 27, 2005

Related U.S. Application Data

(63) Continuation-in-part of application No. 09/957,188, filed on Sep. 20, 2001, now abandoned.

(51) Int. Cl.
*H01L 21/00* (2006.01)

(52) U.S. Cl. .......................... 438/64; 438/118; 438/123

(58) Field of Classification Search ....................... None
See application file for complete search history.

(56) References Cited

U.S. PATENT DOCUMENTS

| | | | |
|---|---|---|---|
| 4,326,214 A | 4/1982 | Trueblood | |
| 4,423,548 A | 1/1984 | Hulseweh | |
| 4,633,573 A | 1/1987 | Scherer | |
| 4,663,833 A | 5/1987 | Tanaka et al. | |
| 4,760,440 A | 7/1988 | Bigler et al. | |
| 5,072,284 A | 12/1991 | Tamura et al. | |
| 5,073,521 A | 12/1991 | Braden | |
| 5,087,964 A | 2/1992 | Hatta | |
| 5,117,279 A | 5/1992 | Karpman | |
| 5,122,861 A | 6/1992 | Tamura et al. | |
| 5,264,393 A | 11/1993 | Tamura et al. | |
| 5,321,204 A | 6/1994 | Ko | |
| 5,382,310 A | 1/1995 | Ozimek et al. | |
| 5,529,959 A * | 6/1996 | Yamanaka | 438/64 |
| 5,650,915 A * | 7/1997 | Alfaro et al. | 361/707 |
| 5,670,009 A * | 9/1997 | Tarn et al. | 156/299 |
| 5,757,485 A * | 5/1998 | Marcus et al. | 356/479 |
| 5,801,074 A | 9/1998 | Kim et al. | |
| 5,821,532 A | 10/1998 | Beaman et al. | |
| 5,851,847 A | 12/1998 | Yamanaka | |
| 5,861,654 A | 1/1999 | Johnson | |
| 5,862,248 A | 1/1999 | Salatino et al. | |
| 5,877,546 A | 3/1999 | You | |
| 5,943,558 A | 8/1999 | Kim et al. | |
| 5,952,714 A | 9/1999 | Sano et al. | |
| 6,011,294 A | 1/2000 | Wetzel | |
| 6,037,655 A | 3/2000 | Philbrick et al. | |
| 6,075,237 A | 6/2000 | Ciccarelli | |

(Continued)

*Primary Examiner*—David E. Graybill
(74) *Attorney, Agent, or Firm*—Peyton C. Watkins (57) ABSTRACT

A low temperature method for producing a substantially flat large area image sensor assembly, the method includes the steps of providing a die attach substrate having a substantially planar surface; providing a lead frame having a bonding surface and a plurality of leads extending there from; adhering an imager die to the substantially planar surface of the die attach substrate with a low curing temperature first adhesive; and adhering the die attach substrate with adhered imager die to a bonding surface of the lead frame with a low curing temperature second adhesive for producing an image sensor assembly.

19 Claims, 7 Drawing Sheets

U.S. PATENT DOCUMENTS

| | | |
|---|---|---|
| 6,093,576 A | 7/2000 | Otani |
| 6,121,675 A | 9/2000 | Fukamura et al. |
| 6,133,637 A | 10/2000 | Hikita et al. |
| 6,184,514 B1 | 2/2001 | Rezende et al. |
| 6,329,219 B1 | 12/2001 | Blouke et al. |
| 6,383,577 B1 | 5/2002 | Chidichimo et al. |
| 6,518,501 B1 | 2/2003 | Kawahara et al. |
| 6,522,410 B1 * | 2/2003 | Marcus et al. ............... 356/497 |
| 6,525,409 B1 | 2/2003 | Matsuo |
| 6,594,892 B2 * | 7/2003 | Ohya et al. ................... 29/846 |
| 6,614,534 B1 * | 9/2003 | Marcus et al. ............... 356/503 |
| 6,643,919 B1 | 11/2003 | Huang |
| 6,652,970 B1 | 11/2003 | Everaerts et al. |
| 6,724,487 B2 * | 4/2004 | Marcus et al. ............... 356/497 |
| 2002/0040522 A1 * | 4/2002 | Ohya et al. ................... 29/846 |
| 2003/0054583 A1 * | 3/2003 | Waldman et al. ............. 438/48 |
| 2003/0227632 A1 * | 12/2003 | Marcus et al. ............... 356/497 |
| 2004/0051957 A1 * | 3/2004 | Liang .......................... 359/656 |
| 2005/0019987 A1 * | 1/2005 | Waldman et al. ........... 438/123 |

* cited by examiner

LARGE AREA FLAT IMAGE SENSOR ASSEMBLY

CROSS-REFERENCE TO RELATED APPLICATIONS

This is a continuation-in-part of application Ser. No. 09/957,188, filed Sep. 20, 2001 now abandoned entitled "A Method For Producing An Image Sensor Assembly" by Jaime I. Waldman et al.

FIELD OF THE INVENTION

The invention relates generally to the field of large image sensors and, more particularly, to such large image sensors that are assembled in a cavity package and are substantially flat over the entire active imager surface providing improved image capture capability.

BACKGROUND OF THE INVENTION

Large area imagers, CCDs and CMOS, are required to be flat to capture a quality image. For many applications, it is required that large area imagers be manufactured to form a substantially flat (with a deviation from flatness of less than 15 microns) active imaging surface over the entire active imaging area. A large area image sensor assembly is defined as a packaged imager having an active sensor area of 20 mm by 20 mm or larger. Currently, these CCD or CMOS imagers are composed of an imager die mounted on either a substrate or mounted in an electronic package. When an imager die is mounted on a substrate, there are several deficiencies that result. The die and bond wires are not protected from damage or debris. Additional potting of the wires or additional structural elements must be added to protect the die and wires. Without these additions, the imager remains unprotected. When currently available electronic cavity packages are used, the wires and imager are protected but the flatness of the imager is not sufficient to meet the needs of many applications including medical imaging sensors and large format digital cameras. Current electronic packages use high temperature methods to join the package components. These high temperatures approximately 400° C. and higher are used to either melt glass, braze or co-fire a ceramic package as methods to join components together. These high temperatures and fastening techniques cause the critical die attach area to which the imager is attached to the electronic package to warp. The die attach area needs to be flat to create a flat imager. Since these are cavity packages, they impede post grinding of the die attach area to repair the warping or bowing of the imager plane created during the high temperature fabrication processes.

Other methods of packaging an image sensor include mounting an imager into an injection molded thermoplastic resin package as disclosed by H. Yamanaka in U.S. Pat. No. 5,529,959. The assembly process includes injection molding of a base with an incorporated lead frame. This patent discloses that small imagers can be made flat by this process without quantifying a definition of flatness. Although injection molding is highly successful for the manufacturing of small imager packages, it is extremely difficult to achieve a base flatness of 10 µm or less in larger areas in excess of 25 mm by 25 mm or larger. U.S. Pat. No. 5,382,310 by Ozimek et al. describe a method to make small conventional solid state image sensors by directly bonding an imager die to a conductive lead frame. The imager bonding pads are then wire bonded to the lead frame. The lead frame and imager are then encapsulated top and bottom with adhesive to provide structural strength. This approach is not amenable to making large area flat imagers. U.S. Pat. No. 6,121,675 by Fukamura et al. describes a method which utilizes silicone to cover the die and wirebonds thus preventing moisture and dirt egress. The flexible material prevents the wire bonds from breaking.

Although the currently known and utilized methods for producing an image sensor assembly are satisfactory for many applications, they include drawbacks. The imagers produced by conventional packaging methods do not have sufficient flatness after the brazing or glass melting process to meet the requirements for large size medical imaging sensors and large format digital cameras. In addition, the flat substrates are not enclosed which obviously limits their ability to mount optical coverglass or protect the sensor and wire bonds.

SUMMARY OF THE INVENTION

The present invention is directed to overcoming one or more of the problems set forth above. Briefly summarized, according to one aspect of the present invention, the invention embodies a low temperature process and method for producing a substantially flat image sensor assembly, the method comprising the steps of (a) providing a die attach substrate having a substantially planar surface; (b) providing a lead frame having a plurality of leads extending therefrom and a shelf on which a cover glass may be attached; (c) attaching an imager for collecting incident light to the substantially planar surface with a low temperature first adhesive substance; and (d) attaching the imager to a portion of the lead frame with a low curing temperature second adhesive substance for producing an image sensor assembly with a flat cavity package.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention has the following advantage of providing a substantially flat image sensor in a substantially flat cavity package while including a shelf on which a cover glass may be attached. The assembly provides a method to protect the bond wires, mount the cover glass and prevent contamination egress onto the sensor without additional structural components.

DETAILED DESCRIPTION OF THE INVENTION

Figure 1:
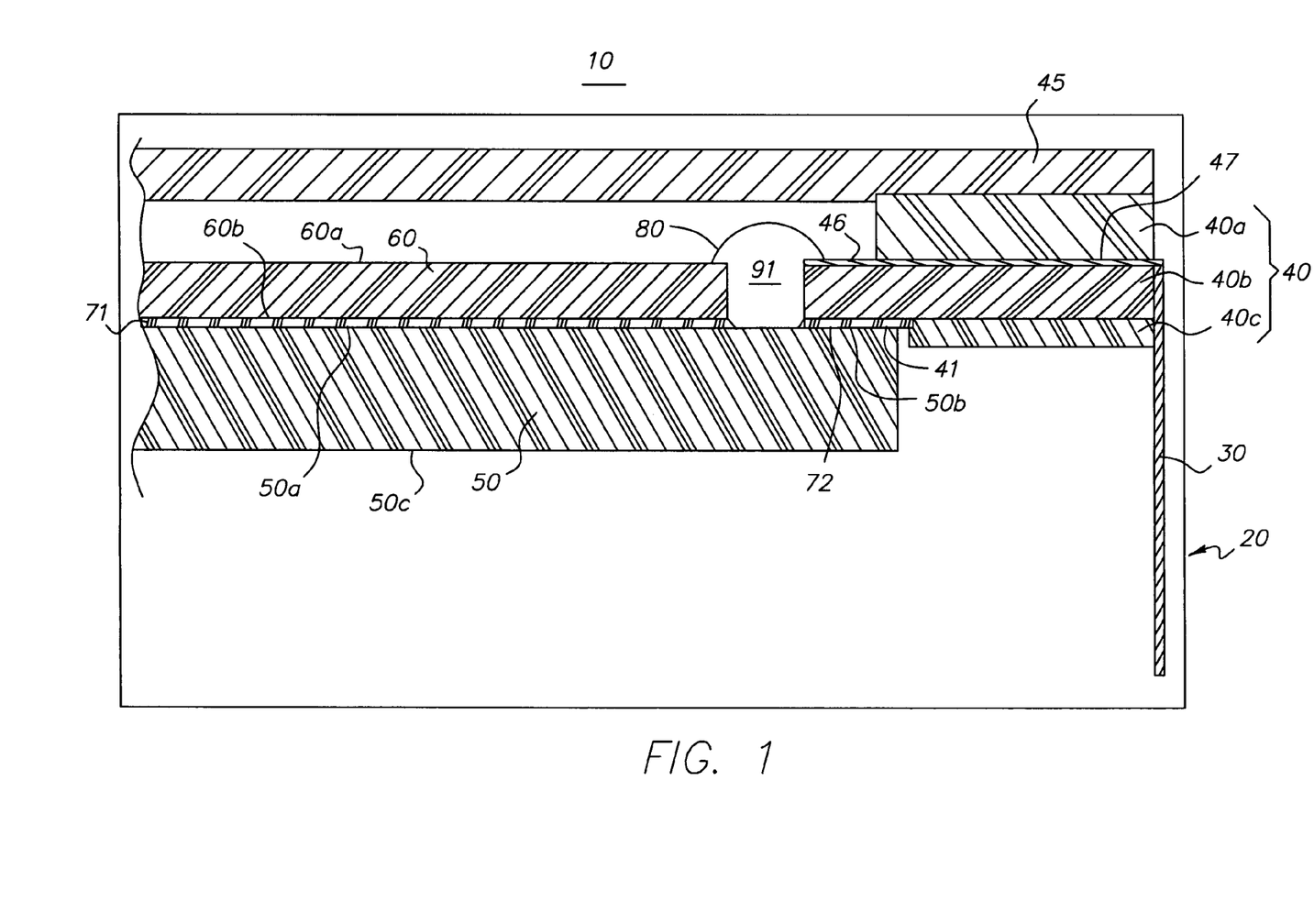
FIG. 1 is a view in vertical cross section of the image assembly of the present invention.

Referring to FIG. 1, the present invention will be described showing only the right most portions of an image sensor assembly 10, and it is to be understood that an exact duplicate portion or mirror image of this portion is on the left portion. In other words, only a portion of the entire image sensor assembly 10 is shown for clarity of understanding. Furthermore, in the following description, like reference characters designate like or corresponding parts throughout the several views of the drawings. Also in the following description, it is to be understood that such terms as "top," "bottom," "left," "right," "upwardly," "downwardly," and the like are words of convenience and are not to be constructed as limiting terms.

The image sensor assembly 10 includes a lead frame 20, usually rectangular in shape, having a plurality of leads 30 (only one is shown) along its edge which can be electrically insulated from each other, and which extend from and are attached to a rectangular shaped lead frame portion 40, and in combination with the frame portion on the opposite side (not shown), forms a hollowed-out portion into which a suitable imager die 60 and suitable die attach substrate 50 is to be inserted. The lead frame portion 40 is a multi-tiered portion extending substantially perpendicular to the leads 30. The lead frame portion 40 of lead frame 20 is shown to have three tiers (or layers), although it is to be understood that more or less tiers could be used and each of these tiers may be made up of more than one layer. The top tier 40a or shelf provides a shelf for affixing a cover glass 45 to enclose the imager assembly. The middle tier 40b is slightly longer then the top tier 40a and it contains metallization such as lead traces 47 used to provide a means of electrically connecting the imager die 60 to the leads 30. Bond pads 46 are contiguous with the lead traces 47 and provide a surface to attach wire bonds 80 to the imager die 60. The bottom portion 40c is used to provide mechanical features for precisely locating the substrate 50 and imager die 60 within the lead frame 20.

An imager die bonding surface 50a of a substrate 50 is ground, lap polished or produced substantially flat, and an imager die 60 (such as silicon die) with an imager active surface 60a and an imager bonding surface 60b is affixed to the flat imager die bonding surface 50a of the substrate 50 at the imager bonding surface 60b by a first adhesive layer 71, such as room temperature curing adhesive, which is located between the two surfaces 50a and 60b. After curing the first adhesive layer 71 the imager and substrate assembly is then attached to the lead frame 20. A second adhesive layer 72, such as epoxy, is applied between the lead frame bonding surface of the substrate 50b and the bonding surface 41 of the lead frame portion 40. The bonding of the lead frame 40 to the substrate 50 results in a flat cavity package.

Bond wires 80 are then attached over the upper gap region 91 between the imager die 60 and middle tier 40b for electrically connecting the two together. As mentioned above, the cover glass 45 is then placed atop the top tier 40a for enclosing the image assembly. The cover glass may or may not incorporate optical characteristics to provide enhanced imaging. The cover glass 45 may also utilize a light shield to block unwanted light from impinging on the wire bonds 80 thus creating spurious illumination onto the imager, as illustrated in U.S. Pat. No. 6,075,237.

Figure 2:
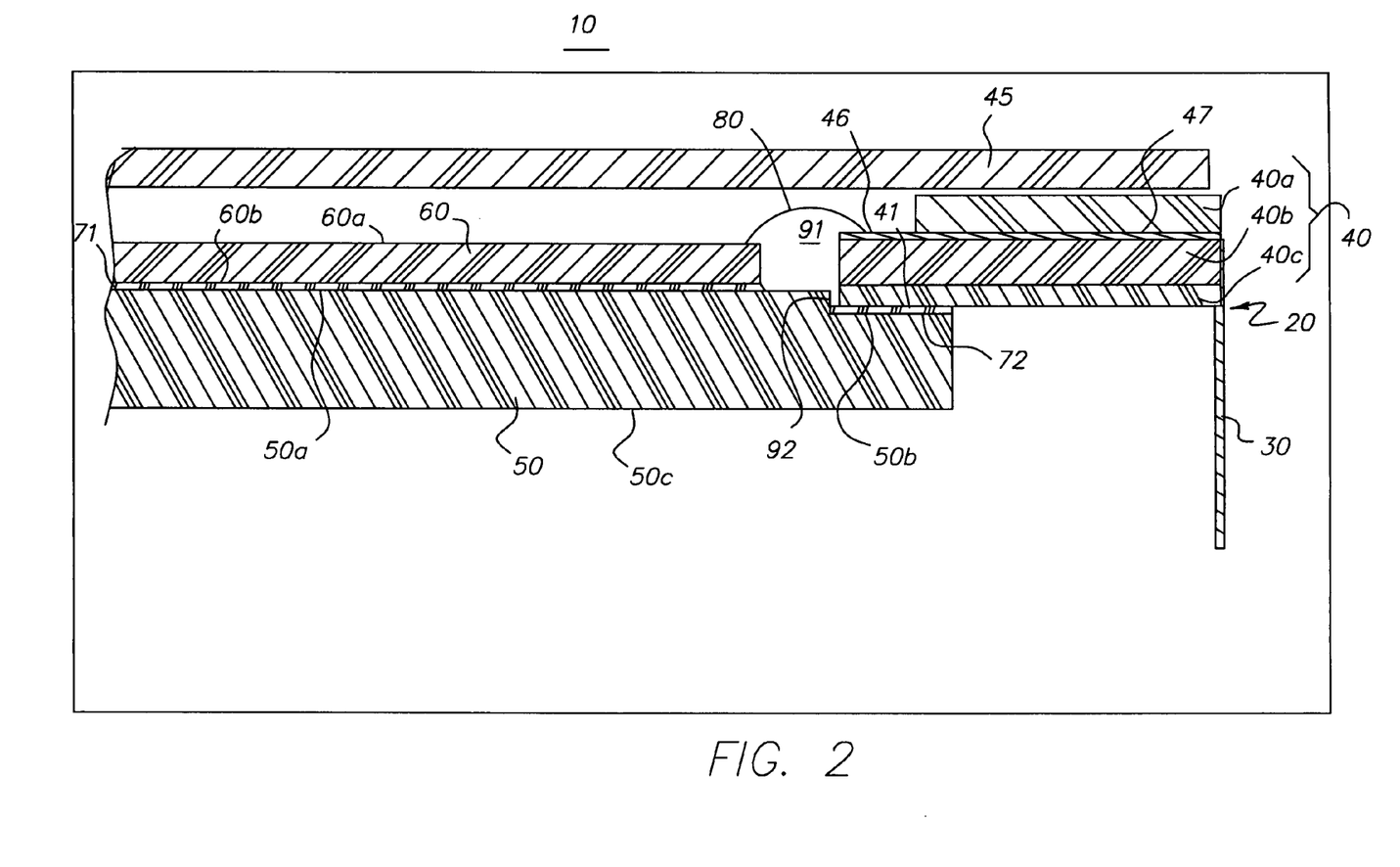
FIG. 2 is a view in vertical cross section of an alternative embodiment of FIG. 1.
Figure 3:
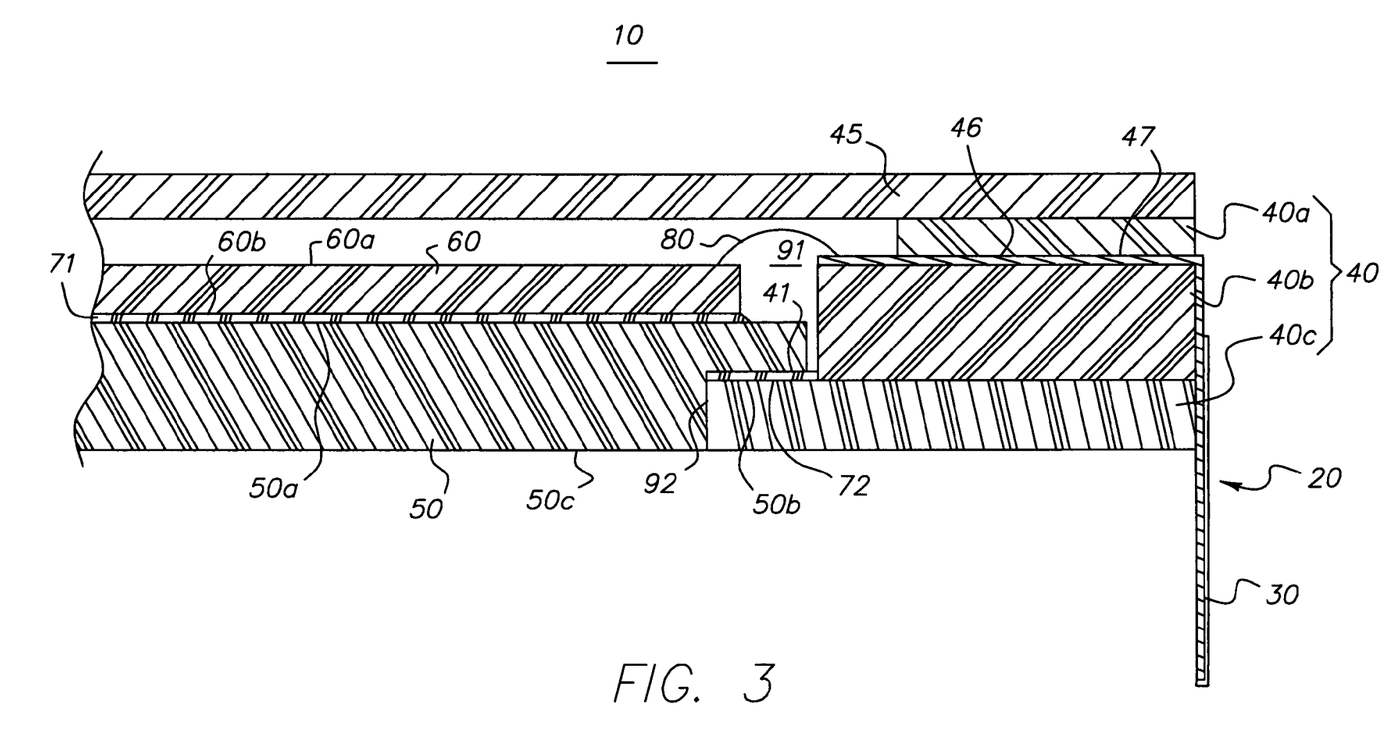
FIG. 3 is a view in vertical cross section of another alternative embodiment of FIG. 1.

Referring to FIG. 2, there is shown an alternative embodiment of FIG. 1. This embodiment is the same as FIG. 1 except for the inclusion of a step 92 in the substrate 50 used for reference positioning and/or constraining the die attach substrate 50 within the lead frame 20. Referring to FIG. 3, there is shown still another alternative embodiment of FIG. 1. In this embodiment, the step 92 is inverted from the position of FIG. 2, and the step 92 performs the same functions.

To provide a proper focal plane, a Charge Coupled Device (CCD) or Complimentary Metal Oxide Semiconductor (CMOS) image sensor assembly 10, and more particular the active surface of the imager die 60, should be as flat as possible. Large image sensors used in medical applications are required to be flat to less than 15 microns. These large image sensors such as the some Kodak® sensors with dimensions 53 mm by 52 mm have less than 15 microns total indicated run-out on the die surface. The Kodak® (sensor typically incorporates 4.3 million 24-micron square pixels. For medical imaging applications, these sensors can have a glass coherent fiber optic bundle optically adhered to their surface. The gap between the fiber optic bundle and the imager must be kept to a minimum in order to provide sufficient imaging properties.

The actual process to produce a flat 53 mm by 52 mm imager is described below in detail. First, a substantially flat die attach substrate 50 must be provided. Double side lap polished aluminum nitride is one material that provides ideal properties for use as the substrate 50. Aluminum nitride has ample heat transfer and dissipation of 179 W/mK and can be plated with a conductive metal if conductivity is required. Double side lap polished aluminum nitride substrates of 0.080 inches thickness and 63 mm square with surface flatness of less than 2microns total indicated run-out (i.e. a substantially planar surface) and thickness uniformity of better than 10 microns have been used as the starting substrate 50. The term substantially planar surface as used herein is defined as a surface having a deviation from flatness as less than 5 microns over the entire surface.

Figure 4:
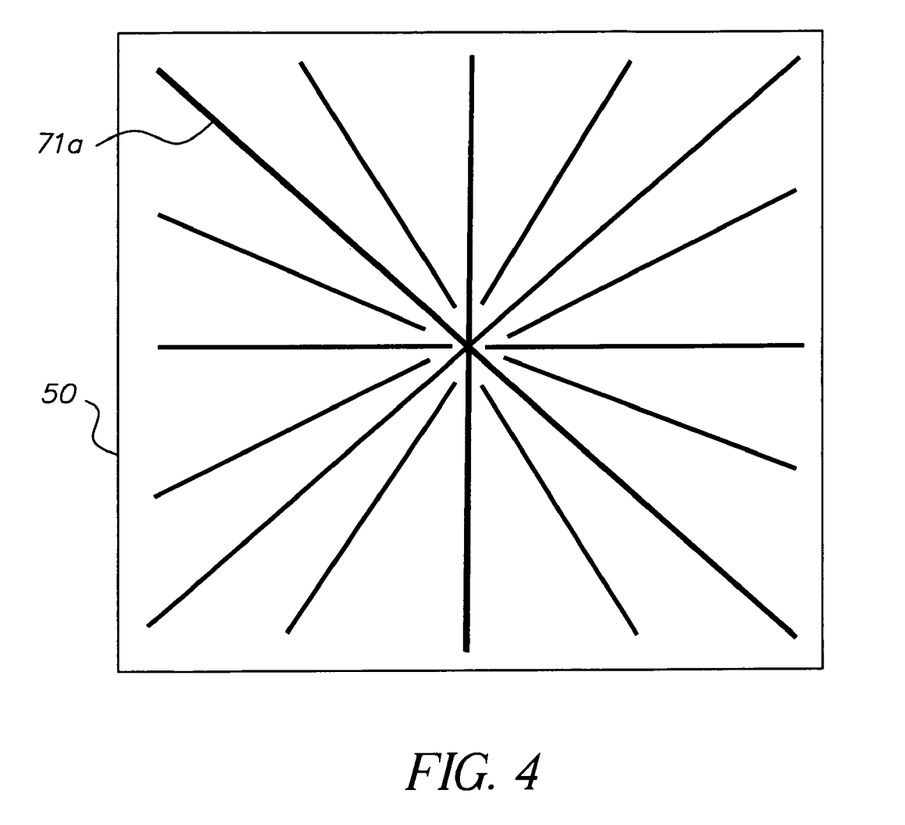
FIG. 4 is a top view of the first adhesive layer pattern.

Room temperature curing adhesive or epoxy is used to adhere the imager die 60 to the die attach substrate 50. The adhesive must also be of the type that does not stress the imager die 60 upon curing which would cause warping of the components. The adhesive should also be low outgassing in nature. The die attach adhesive which forms the first adhesive layer 71 can also incorporate beads of known and tightly controlled size distribution. These beads are of a material which is of a significantly higher modulus of elasticity than the die attach adhesive carrier material. These beads can be conductive in order to allow for electrical and thermal conduction. An important benefit of the beads is to provide a uniform first adhesive layer 71 thickness as the die is pressed against the die attach substrate 50. An appropriate first adhesive layer thickness is in the range of 0.5 to 1.0 mil. A proper first adhesive layer pattern 71a (shown in FIG. 4) is made on the die attach substrate 50. This pattern 71a is typically of a star shape without excessive loading in the center as shown in FIG. 4. The pattern is put down with an adhesive dispenser. The shape of the pattern is designed to allow air to escape upon compression of the die onto the die attach adhesive and to spread the adhesive uniformly over the surface of the substrate. The lines forming the pattern in FIG. 4 are typically 20-40 mils wide. Alternatively, the pattern could be put down using a template. Zymet ZVR-6000.2, an ultra-low stress adhesive has been found suitable for use in this operation.

Figure 5A:
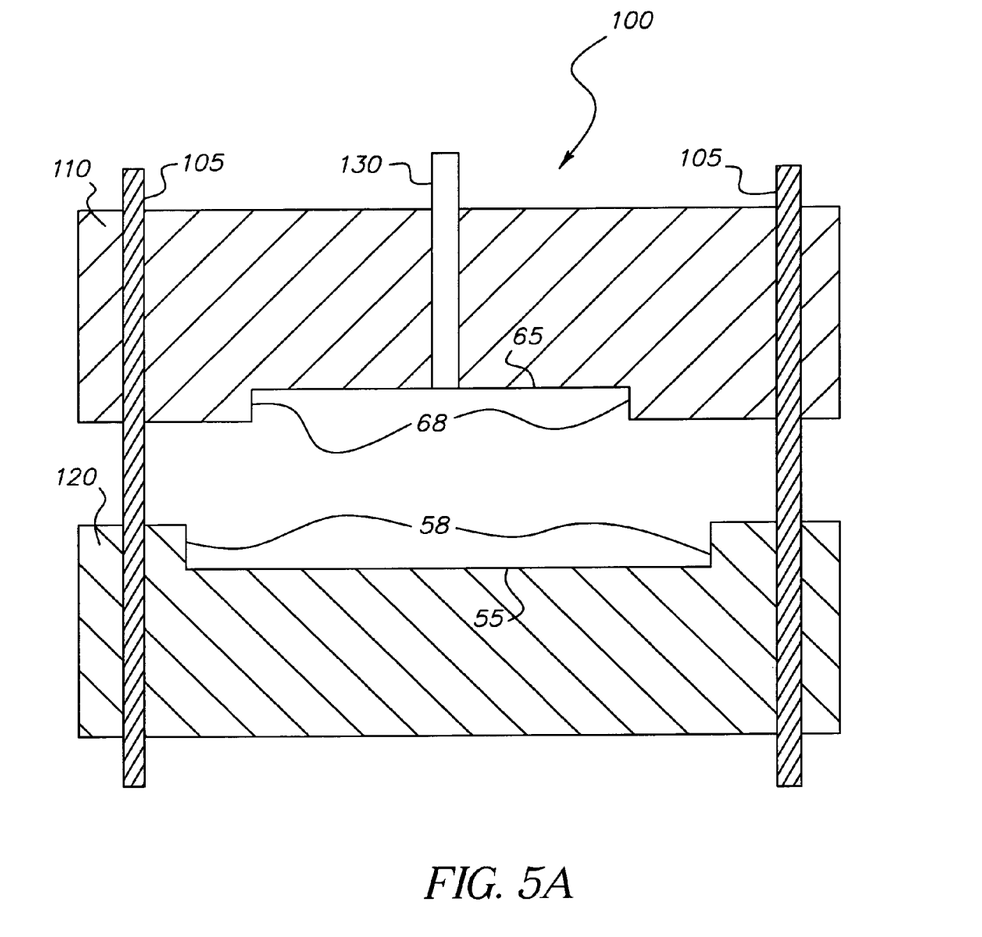
FIG. 5A is a view in vertical cross section of an imager die to substrate alignment fixture without the die and substrate.
Figure 5B:
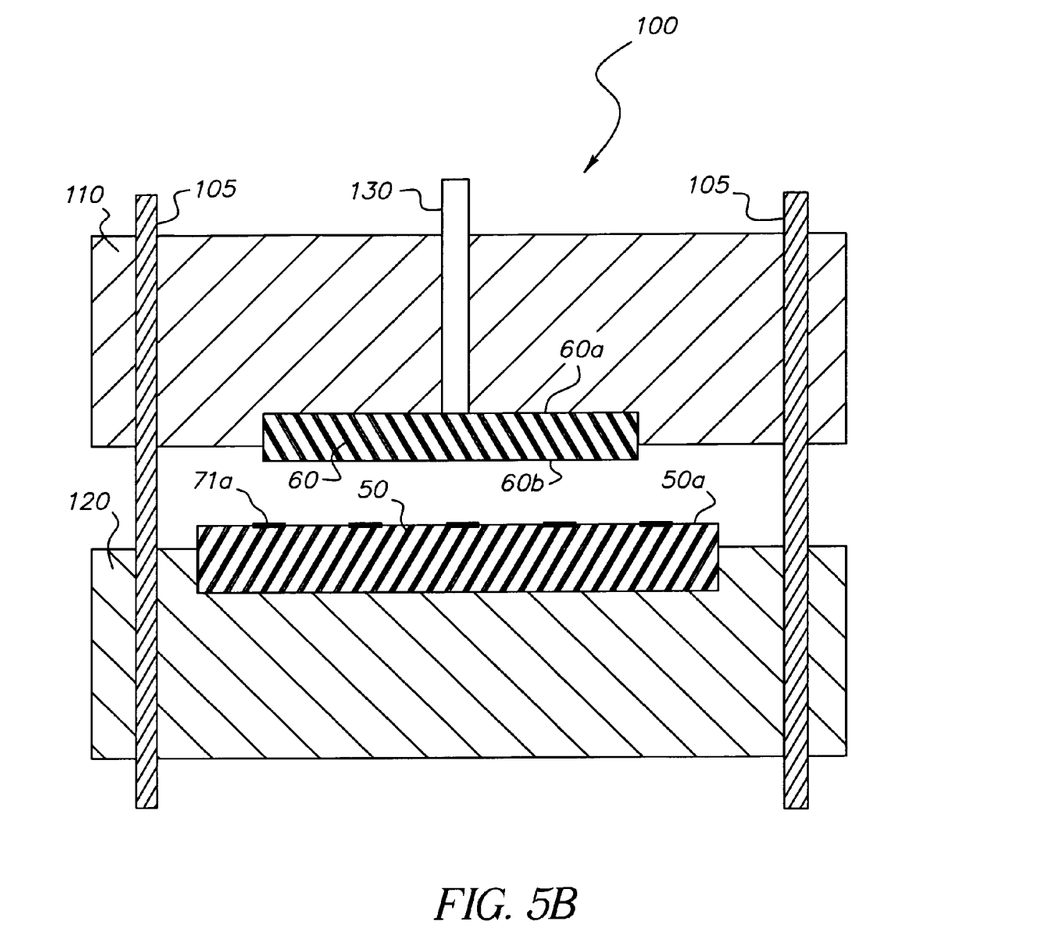
FIG. 5*b* is a view in vertical cross section of an imager die to substrate alignment fixture with the die and substrate mounted in place.

A die attach fixture 100 shown in FIGS. 5A and 5B is used to adhere the imager die 60 to the substrate 50. The die attach fixture 100 consists of a pair of aligned parallel first and second metal plates 120 and 110 held in fixed orientation by a set of linear guides 105 (typically 4). The second plate 110 incorporates a vacuum port 130 and an imager die recess 65 on its surface facing the first plate 120. The vacuum port 130 is used to provide vacuum to hold the imager die in place prior to the pressing operation for securing the imager die 60 onto the die attach substrate 50 in the correct x, y locations within 50 microns in x and y. The imager die 60 is cut from a wafer so that it fits snuggly and matingly into the die recess sidewalls 68 of the imager die recess 65 of the second plate 110. The first plate 120 includes a substrate recess 55 with substrate recess sidewalls 58 on its surface facing the second plate 110. This recess similarly constrains the x and y locations of the substrate 50 to within 50 microns x and y. The combination of the linear guides 105 and the fixed locations of the substrate recess 55, substrate recess side walls 58, imager die recess 65 and die recess side walls 68 provides an alignment mechanism for precisely positioning the imager die 60 with respect to the substrate 50. The substrate fits snuggly into the substrate recess 55 to provide precision placement of the imager die 60 on the substrate 50. The substrate 50 with first adhesive layer pattern 71a facing toward the second plate 110 is placed into the substrate recess 55. Alternatively, the adhesive pattern can be applied after mounting the substrate 50 into the substrate recess 55. The vacuum pump (not shown) is turned on when the imager die 60 with its imager active surface 60a facing the vacuum port 130 and its imager bonding surface 60b facing the first plate 120 is inserted into the imager die recess 65 to provide suction in the vacuum port 130. The second plate 110 of the die attach fixture 100 is then pressed against the first plate 120 until uniform contact is made between the imager bonding surface 60b and the imager die bonding surface 50a of the substrate 50 patterned with first adhesive 71a. The linear guides 105 and the parallelism of the plates 110 and 120 ensure that an even force distribution is obtained over the entire imager surface during assembly. Constant pressure is applied for a period of time. Typical pressures of 2 psi are utilized during pressing. When the pressure is applied the adhesive spreads out evenly over the imager bonding surface 60b to form a continuous layer of first adhesive 71. The vacuum is shut off after contact is made between the imager die 60 and substrate 50 surfaces. Accurate z position is maintained from the top of the die attach substrate to the surface of the die with the utilization of the beads in the first adhesive. Since the die attach substrate 50 is substantially flat with a deviation in thickness of less than 10 microns and a flatness of the imager bonding surface of the substrate of 2 microns or less the z height of the bonded imager die 60 varies by less than 15 microns with respect to the second surface of the die attach substrate 50c. After pressing for about 0.3-5 minutes the pressure is removed and the die attach adhesive is then allowed to cure at room temperature for approximately 6 hours. The combination of 2 psi and 30 seconds compression time has been found to be sufficient to result in a uniform 0.8-1.0 mil thick first adhesive layer. When cured at room temperature no thermal expansion or contraction is induced to cause die warping. Alternatively, it has been found that curing at 100° C. for one hour does not adversely affect the observed flatness of the imager using Zymet ZVR 6000.2 or similar adhesives due to the fact that the modulus of the adhesive is so low. Low curing temperature as used herein is defined as covering the temperature range of substantially between 20 to 120 degrees C. Desired properties of the first adhesive layer include a modulus of elasticity in the range of 0.5 to 50 MPascal.

The substrate 50 with adhered imager die 60 is next adhered to a lead frame 20. The lead frame 20 incorporates a plurality of leads 30 or pins to connect to a circuit board. The lead frame 20 incorporates a lead frame portion 40 of material such as alumina and also incorporates bond pads 46 that are electrically connected to the leads 30 by lead traces 47. Room temperature cure (20-25 degrees C.) low outgassing adhesive (Ablestik brand for example) is applied as second adhesive layer 72 to secure the alumina frame portion to the die attach substrate. The second adhesive is preferably applied as a 2 mil thick film gasket and can also be dispensed. When cured at low temperature, thermal expansion mismatches are minimized. Once cured, the second adhesive can provide a stress relief between the die attach substrate and the lead frame portion should subsequent temperature fluctuations occur. The die attach substrate can be designed with a step 92 as shown in FIG. 2 so that it can fit into the alumina frame portion for better mechanical fastening and improved x,y positioning. A low force clamping technique is used that will provide minimal stress upon the die attach substrate so that exceptional flatness of the alumina frame portion is not critical when the two surfaces are co-joined. The second adhesive squeezes out to fill any voids left by a flatness mismatch of the alumina frame and provides sufficient mechanical attachment.

The bond pads on the die are next electrically attached to the bond pads 46 on the lead frame 20 by wirebonding wires 80. Aluminum wire wedgebonding is preferred for the assembly of flat imagers since this can be performed at room temperature. The lead frame portion 40a can also be used as a mount to secure a protective optical window 45. This window prevents particles from coming in contact with the die. The window can be secured with room temperature cure adhesive or sealed with tape to keep particles out. Permacel Kapton P-224 tape has been found suitable and allows for easy removal of the window if required by the customer.

EXAMPLE 1

Figure 6:
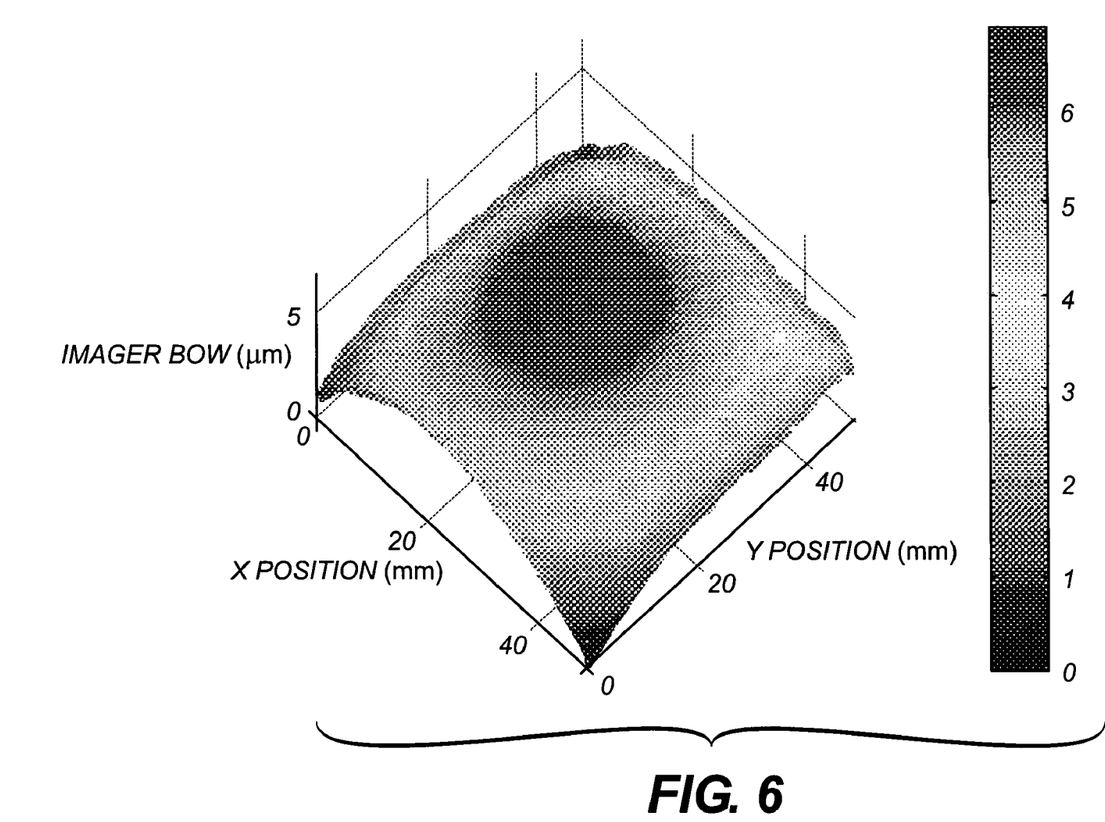
FIG. 6 is a leveled surface map of an imager mounted in a package using the inventive method and apparatus of this invention.

The flatness of typical image sensors (imagers 53 mm by 52 mm) as described and assembled by the above described method were tested using a low coherence light interferometric apparatus described in U.S. Pat. No. 6,724,487. Flatness data were obtained and the maximum bow of a typical set of typical Kodak® (imagers (53×52 mm) are shown in Table 1. FIG. 6 shows a leveled surface map of imager #149 mounted in a package obtained using the low coherence light interferometric apparatus described in U.S. Pat. No. 6,724,487.

TABLE 1

| Imager # | Deviation from flatness (microns) |
| --- | --- |
| 145 | 6.26 |
| 146 | 6.84 |
| 147 | 4.69 |
| 148 | 6.82 |
| 149 | 6.41 |
| 150 | 6.51 |
| 151 | 7.89 |
| 152 | 8.50 |
| 153 | 8.02 |
| Average | 6.88 |
| Stdev | 1.14 |
| Max | 8.50 |
| Mm | 4.69 |
| Range | 3.81 |

COMPARATIVE EXAMPLE 1

The data shown in Table 2 were obtained on Kodak® imagers (53 52 mm) made with conventional commercially available packages of alumina with a brazed copper tungsten substrate. The flatness of these imagers was tested by the same method described in Example 1.

TABLE 2

| Imager # | Deviation from flatness |
| --- | --- |
| 13 | 57.6 |
| 14 | 46.1 |
| 27 | 53.4 |
| 30 | 78.3 |
| 31 | 68 |
| 32 | 64.5 |
| 45 | 35.4 |
| 47 | 42.2 |
| 65 | 35.2 |
| 68 | 52.4 |
| 74 | 48.7 |
| 83 | 60.1 |
| 86 | 55.9 |
| 91 | 33.1 |
| 93 | 38.4 |
| Average | 51.28 |
| stdev | 13.23 |
| max | 78.3 |
| Min | 33.1 |
| range | 45.2 |

The invention has been described in detail with particular reference to certain preferred embodiments thereof, but it will be understood that variations and modifications can be effected within the spirit and scope of the invention.

PARTS LIST 10 image sensor assembly
20 lead frame
30 leads
40 lead frame portion
40a top tier or shelf of frame portion
40b middle tier portion of frame portion
40c bottom tier of frame portion
41 bonding surface of lead frame
45 cover glass/optical window
46 bond pads
47 lead traces
50 die attach substrate
50a imager die bonding surface of substrate
50b lead frame bonding surface of substrate
50c second surface of substrate
55 substrate recess
58 substrate recess sidewalls
60 imager die
60a imager active surface
60b imager bonding surface
65 imager die recess
68 die recess sidewalls
71 first adhesive layer
71a first adhesive layer pattern
72 second adhesive layer
80 wire bonds
91 upper gap region
92 step
100 die attach fixture
105 linear guide
110 second metal plate
120 first metal plate
130 vacuum port/line

The invention claimed is:

1. A low temperature method for producing a substantially flat large area image sensor assembly, the method comprising the steps of:
    (a) providing a die attach substrate having a substantially planar surface;
    (b) providing a lead frame having a bonding surface and a plurality of leads extending there from;
    (c) adhering an imager die to the substantially planar surface of the die attach substrate with a low curing temperature first adhesive wherein step (c) further comprises the steps in any order:
        (c1) dispensing said first adhesive onto the die attach substrate in a desired pattern;
        (c2) placing said die attach substrate with first adhesive pattern into the substrate recess of a first plate of a die attach fixture;
        (c3) placing the imager die into the imager die recess of a second plate of the die attach fixture while applying vacuum through a vacuum port in said second plate; and
    wherein, after steps (c1) through (c3), step (c) further comprises in sequential order the steps of:
        (c4) bringing the second plate towards the first plate of the die attach fixture to provide an even force distribution over the entire imager surface;
        (c5) pressing the first and second plate at constant pressure for a period of time; and
        (c6) removing the pressure, the vacuum and the die attach substrate with adhered imager die for curing; and
    (d) adhering the die attach substrate with adhered imager die to a bonding surface of the lead frame with a low curing temperature second adhesive for producing an image sensor assembly.

2. The method as in claim 1, wherein step (c) includes the step of curing the adhesive at room temperature.

3. The method as in claim 1, wherein step (b) includes providing a substantially rectangular shaped lead frame.

4. The method as in claim 1 wherein said imager die has an active surface dimensions of substantially 20 by 20 mm or greater and a deviation from flatness of the active imager surface of less than substantially 15 microns.

5. The method as in claim 1 wherein said imager die has an active surface dimensions of substantially 35 by 35 mm or greater and a deviation from flatness of the active imager surface of less than substantially 10 microns.

6. The method as in claim 1 further comprising providing an alignment mechanism for precisely positioning the imager die with respect to the substrate.

7. The method as in claim 1, wherein said die attach substrate is composed of aluminum nitride.

8. The method as in claim 1, wherein said die attach substrate is double side lap polished to maintain a surface flatness of less than 2 microns total indicated run-out.

9. The method as in claim 1 wherein the adhesive contains beads to provide a uniform first adhesive layer thickness as the die is pressed against the die attach substrate.

10. The method as in claim 1 wherein a z height of the bonded imager die varies by less than 15 microns with respect to the second surface of the die attach substrate.

11. The method as in claim 1, wherein step (c) includes the step of curing the first adhesive at room temperature.

12. The method as in claim 1, wherein step (b) includes providing a substantially rectangular shaped lead frame.

13. The method as in claim 1 wherein said imager die has an active surface dimensions of substantially 20 by 20 mm or greater and a deviation from flatness of the active imager surface of less than substantially 15 microns.

14. The method as in claim 1 wherein said imager die has an active surface dimensions of substantially 35 by 35 mm or greater and a deviation from flatness of the active imager surface of less than substantially 10 microns.

15. The method as in claim 1 further comprising providing an alignment mechanism for precisely positioning the imager die with respect to the substrate.

16. The method as in claim 1, wherein said die attach substrate is composed of aluminum nitride.

17. The method as in claim 1 wherein said die attach substrate is double side lap polished to maintain a surface flatness of less than 2 microns total indicated run-out.

18. The method as in claim 1 wherein the adhesive contains beads to provide a uniform first adhesive layer thickness as the die is pressed against the die attach substrate.

19. The method as in claim 1 wherein a z height of the bonded imager die varies by less than 15 microns with respect to the second surface of the die attach substrate.

* * * * *